United States Patent
Song et al.

(10) Patent No.: US 10,312,891 B1
(45) Date of Patent: Jun. 4, 2019

(54) VARIATION TRACKING AND COMPENSATING FOR SMALL CAPACITOR

(71) Applicant: QUALCOMM Incorporated, San Diego, CA (US)

(72) Inventors: Chao Song, San Diego, CA (US); Zhengzheng Wu, Santa Clara, CA (US); Haitao Cheng, San Diego, CA (US); Ye Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/142,476

(22) Filed: Sep. 26, 2018

(51) Int. Cl.
*H03K 5/00* (2006.01)
*H01L 49/02* (2006.01)
*H01L 27/06* (2006.01)
*H03K 19/20* (2006.01)

(52) U.S. Cl.
CPC ........... *H03K 5/00* (2013.01); *H01L 27/0629* (2013.01); *H01L 28/86* (2013.01); *H03K 19/20* (2013.01); *H03K 2005/00019* (2013.01)

(58) Field of Classification Search
CPC ............................................ H03K 2005/00123
See application file for complete search history.

(56) References Cited

U.S. PATENT DOCUMENTS 5,352,945 A * 10/1994 Casper .................... H03K 5/133
  327/261
6,054,884 A *  4/2000 Lye ......................... H03K 5/131
  327/269

\* cited by examiner

*Primary Examiner* — Jeffery S Zweizig
(74) *Attorney, Agent, or Firm* — Qualcomm Incorporated (57) ABSTRACT

In certain aspects, an integrated circuit comprises a signal path having a path delay from an input to an output, wherein the signal path comprises a path capacitor having a path capacitance. The integrated circuit also comprises a variation tracking circuit coupled to the signal path, wherein the variation tracking circuit comprises a tracking resistor have a tracking resistance, and wherein a product of the tracking resistance and the path capacitance is substantially constant over process variation.

25 Claims, 6 Drawing Sheets

VARIATION TRACKING AND COMPENSATING FOR SMALL CAPACITOR

BACKGROUND

Field

Aspects of the present disclosure relate to small capacitor variation, and more particularly, to structures and methods for tracking and compensating the variation of small capacitors in circuit design.

Background

Capacitors store and release electrical charge. Among numerous other uses, capacitors are commonly used to load a logic gate to adjust the amount of the signal propagation delay from an input to an output (e.g., a delay line) or a frequency of a voltage control oscillator (VCO). A capacitor in an integrated circuit can be formed using parallel conducting plates that are formed between layers of a die (often referred as a plate capacitor), such as two layers of metals, metal 1 and metal 2. Another way to form a capacitor in an integrated circuit is using interdigitated fingers of metal lines in the same layer of the die (often referred as a finger capacitor). The capacitance of a finger capacitor is mainly derived from the lateral side-to-side fringe capacitance between the neighboring fingers.

The capacitance of both a plate capacitor or a finger capacitor is highly dependent on, e.g., the thickness, width, and spacing of the metal layers or metal lines. As the process technology scales into sub-micron range, the amount of process variation becomes more pronounced as the variation becomes a larger percentage of the full length, width, or spacing of a structure. Process variation causes measurable variance in capacitance in a capacitor, such as the plate capacitor or finger capacitor. The variation in capacitance, in turn, causes variance in output performance of a circuit, such as a delay line or a VCO. Therefore, it is beneficiary to track and compensate the variation of a capacitor due to process variation.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, an integrated circuit comprises a signal path having a path delay from an input to an output, wherein the signal path comprises a path capacitor having a path capacitance. The integrated circuit also comprises a variation tracking circuit coupled to the signal path, wherein the variation tracking circuit comprises a tracking resistor having a tracking resistance, and wherein a product of the tracking resistance and the path capacitance is substantially constant over process variation.

In another aspect, a method comprises delaying a signal from an input to an output through one or more logic gates having a path delay, wherein at least one of the one or more logic gates is loaded with a path capacitor having a path capacitance. The method also comprises coupling a variation tracking circuit to the one or more logic gates, wherein the variation tracking circuit comprises a tracking resistor having a tracking resistance, and wherein a product of the tracking resistance and the path capacitance is substantially constant over process variation, and wherein the path delay is substantially constant over process variation.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

A capacitor is a passive two-terminal electrical component that stores potential energy in an electric field. The effect of a capacitor is known as capacitance. Most capacitors contain at least two electrical conductors often in the form of metallic plates or surfaces separated by a dielectric medium. In integrated circuit, the conductor is usually the metal layer of aluminum or copper. The capacitance of a capacitor is proportional to the surface area of the plates (conductors) and inversely related to the gap between them. The continuing scaling of the process technology and the increasing demand of integration level ask for ever smaller capacitor on die, yet the amount of process variation becomes more pronounced as the variation becomes a larger percentage of the sizes of the capacitors. Tracking and compensating the variation of a capacitor, particularly a small capacitor, therefore, is beneficial to circuit design. However, a small capacitance is difficult to measure or track by on-die circuitry. An alternative tracking or measuring mechanism is needed.

Figure 1A:
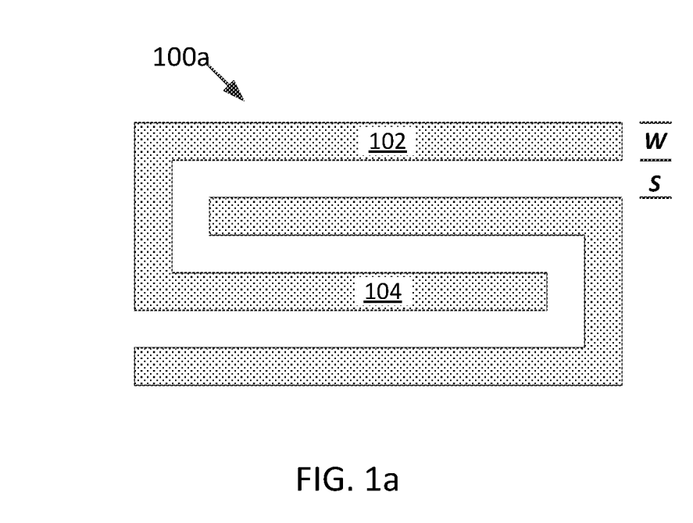
FIG. 1a illustrates an exemplary finger capacitor according to certain aspects of the present disclosure.

FIG. 1a illustrates an exemplary finger capacitor 100a according to certain aspects of the present disclosure. The finger capacitor 100a comprises two interdigitated fingers 102 and 104. Both interdigitated fingers 102 and 104 are in the same layer of metals, such as Metal 1. Between two interdigitated fingers 102 and 104 is a dielectric material (not shown). Each of the interdigitated fingers 102 and 104 has a width of W. The spacing between two neighboring fingers is S. Each of the interdigitated fingers 102 and 104 serves as one terminal of the finger capacitor 100a.

The capacitance of the finger capacitor 100a is mainly from coupling of two interdigitated fingers 102 and 104 facing each other. The capacitance value can be approximated as $$C_f = \varepsilon_f \frac{L_c \times T_f}{S},$$

wherein $C_f$ is the capacitance of the finger capacitor 100a. $E_f$ is the dielectric constant of the dielectric material between the two interdigitated fingers 102 and 104. $L_c$ is the length of the interdigitated fingers 102 and 104, $T_f$ is the thickness of the metal layer, and S is the spacing of the neighboring fingers.

The length $L_c$ of the interdigitated fingers 102 and 104 is relative large compared to the length variation. The variation that affects the capacitance $C_f$ mainly comes from the variation of the metal thickness $T_f$, metal width W, and the finger spacing S. In an interdigitated finger capacitor, such as the finger capacitor 100a, the finger width W and the finger spacing S are often correlated. If the finger width W increases, the finger spacing S generally decreases proportionally or vice versa. Therefore, if there is a structure that mimics the variation of the finger width W and the metal thickness $T_f$, it could be used for tracking the variation of the capacitance $C_f$.

Figure 1B:
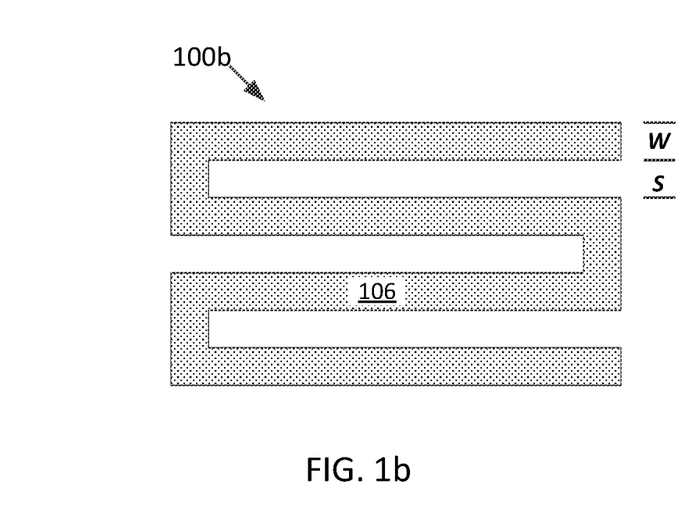
FIG. 1b illustrates an exemplary resistor that tracks the variation of a finger capacitor according to certain aspects of the present disclosure.

FIG. 1b illustrates an exemplary resistor 100b that tracks the variation of a finger capacitor according to certain aspects of the present disclosure. The resistor 100b comprises a serpentine metal line 106 in the same metal layer as the interdigitated fingers 102 and 104. Since the serpentine metal line 106 and the interdigitated fingers 102 and 104 are in the same metal layer, they are fabricated with the same mask and with the same process steps. They experience the same process variation. Like the interdigitated fingers 102 and 104, the width of the serpentine metal line 106 is also W and the spacing is S. The two ends of the serpentine metal line 106 are the two terminals of the resistor 100b. The resistance is therefore $$R_f = \rho_f \frac{L_r}{W \times T_f}.$$

Here, $R_f$ is the resistance of the resistor 100b, $\rho_f$ is the resistivity of the metal layer, $L_r$ is the length of the serpentine metal line 106, $T_f$ is the thickness of the metal layer, and S is the spacing of the neighboring lines of the serpentine metal line 106.

The product of the resistance $R_f$ and capacitance $C_f$ therefore is $$R_f C_f = \rho_f \varepsilon_f \frac{L_r L_c}{W \times S}.$$

The metal thickness $T_f$ is cancelled and is not a factor of the RC product $R_f C_f$. The width and spacing variation still show up in the RC product $R_f C_f$. However, due to the strong correlation of W and S, the effect of the variation is reduced to a second order. For example, if the width W varies by decreasing a % due to over etching, the spacing S will increase by about a % accordingly (typically the width W and the spacing S are about the same). Therefore, the product of W and S becomes $$W(1-a\%) \times S(1+a\%) \approx W \times S(1-0.01a^2\%).$$

The above equation shows that a 10% variation in width and spacing will only subject the RC product variation to around 1%. In other words, the resistance of the resistor 100b closely tracks the capacitance of the finger capacitor 100a. If the capacitance of the finger capacitor 100a varies by a certain amount due to structure geometry variation, e.g., decreases by a %, the resistance of the resistor 100b varies accordingly in opposite direction by a similar amount, e.g., increases by about a %. Tracking the variation of the resistor 100b is thus similar to tracking the variation of the finger capacitor 100a.

Resistor tracking is often simpler for on-die circuit and is often more accurate. In order to better track the variation of the finger capacitor 100a, the resistor 100b is placed close to the finger capacitor 100a. For example, the finger capacitor 100a and the resistor 100b may be next to each other. In addition, the length of the serpentine metal line 106 $L_r$ should be long enough to minimize the variation in length itself.

Figure 2A:
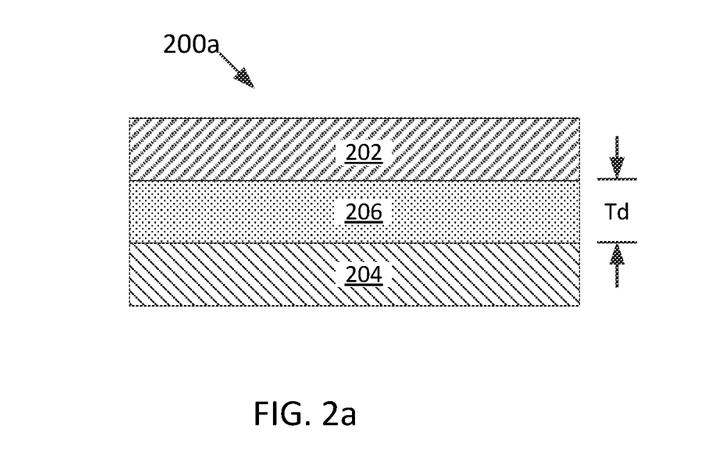
FIG. 2a illustrates an exemplary plate capacitor according to certain aspects of the present disclosure.

FIG. 2a illustrates an exemplary plate capacitor 200a according to certain aspects of the present disclosure. The plate capacitor 200a comprises a first plate 202 in a first metal layer and a second plate 204 in a second metal layer with a dielectric layer 206 in-between. The dielectric layer 206 has a thickness $T_d$. The plate capacitance $C_p$ can be approximated as $$C_p = \varepsilon_p \frac{A_p}{T_d}.$$

Here, $\varepsilon_p$ is the dielectric constant of the dielectric layer 206 between the two metal plates 202 and 204. $A_p$ is the area of the plates 202 and 204. Generally, for a plate capacitor, the area $A_p$ is much larger than amount of variation. The variation of the plate capacitance $C_p$ mainly comes from the dielectric layer thickness $T_d$.

Figure 2B:
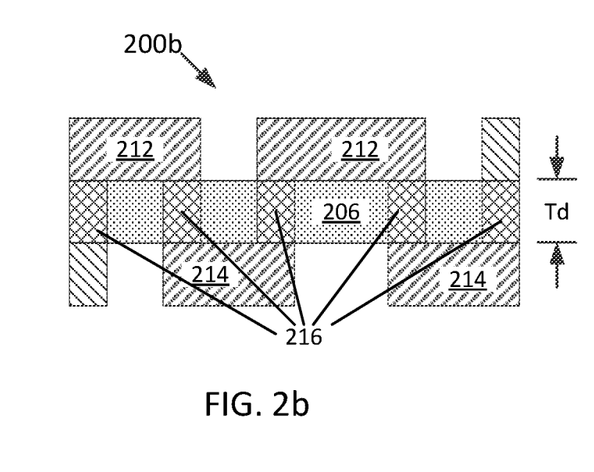
FIG. 2b illustrates an exemplary resistor that tracks the variation of a plate capacitor according to certain aspects of the present disclosure.

FIG. 2b illustrates an exemplary resistor 200b that tracks the variation of a plate capacitor according to certain aspects of the present disclosure. The resistor 200b comprises a plurality of vias 216 connected serially through a plurality of metal pieces 212 and 214 in an alternating order. The plurality of vias 216 are in the dielectric layer 206. The plurality of metal pieces 212 are in the first metal layer and the plurality of metal pieces 214 are in the second metal layer. The plurality of vias 216 experiences the same process variation as the dielectric layer 206 in terms of the height or dielectric layer thickness $T_d$. The resistance of the resistor 200b is therefore $$R_p = \rho_p \frac{N \times T_d}{A_v}.$$

Here, $R_p$ is the resistance of the resistor 200b, $\rho_p$ is the resistivity of the plurality of vias 216, $A_p$ is the cross-section area of each of the plurality of vias 216, N is the number of the plurality of vias 216.

The product of the resistance $R_p$ and capacitance $C_p$ therefore is $$R_p C_p = \rho_p \varepsilon_p \frac{N \times A_p}{A_v}.$$

The dielectric layer thickness $T_d$ is cancelled and is not a factor of the RC product $R_p C_p$. Therefore, the RC product $R_p C_p$ is less susceptible to process variation. Tracking the variation of the resistor 200b is thus similar to tracking the variation of the plate capacitor 200a.

In order to better track the variation of the plate capacitor 200a, the resistor 200b is placed close to the plate capacitor 200a. For example, the plate capacitor 200a and the resistor 200b may be next to each other. In addition, one would minimize the resistance caused by the plurality of metal pieces 212 and 214. For example, wide metal pieces may be used. Moreover, to minimize the variation of via cross-section area $A_v$, a large amount of vias, N, may be needed. Multiple vias may be placed in parallel instead of just one via.

Figure 3:
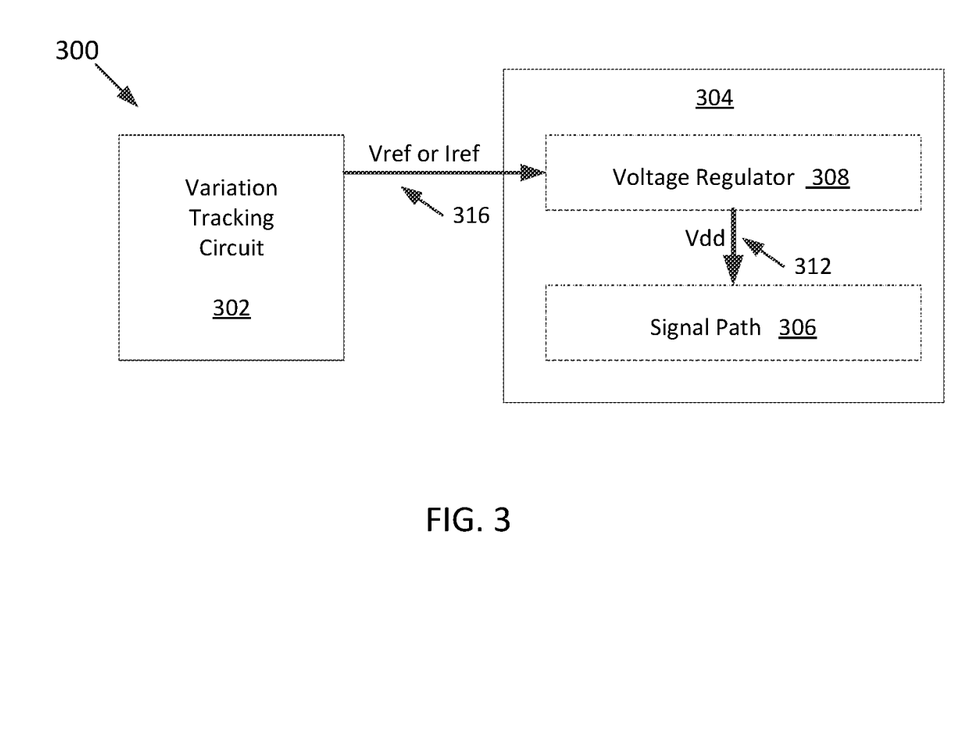
FIG. 3 illustrates an exemplary integrated circuit tracking a capacitor variation with a resistor according to certain aspects of the present disclosure.

FIG. 3 illustrates an exemplary integrated circuit 300 tracking a capacitor variation with a resistor according to certain aspects of the present disclosure. The integrated circuit 300 comprises a circuit for tuning 304. The circuit for tuning 304 includes a signal path 306 which has one or more logic gates loaded with a respective one or more path capacitors, such as a finger capacitor 100a or a plate capacitor 200a. The signal path has a path delay from an input to an output. The signal path, for example, may be a delay line or a voltage control oscillator (VCO). For a delay line, the path delay is the propagation delay from the input of the delay line to the output of the delay line. For a voltage control oscillator (VCO), the output may be coupled back to the input and the path delay is correlated to the oscillator frequency.

The circuit for tuning 304 further includes a voltage regulator 308. The voltage regulator 308 receives a reference signal 316, e.g., a voltage reference Vref or a current reference Iref, and adjusts the supply voltage Vdd to the signal path 306 based on the reference signal 316. The voltage regulator 308 may be a low dropout regulator, a switching regulator, or any other suitable implementation.

The integrated circuit 300 also comprises a variation tracking circuit 302 by tracking the variation of a related tracking resistor, such as a corresponding resistor 100b or a corresponding resistor 200b. The variation tracking circuit 302 has an output 316 providing reference signal, e.g., a voltage reference Vref or a current reference Iref. The voltage or current reference Vref or Iref varies with the resistor (thus the corresponding capacitor). By varying the reference signal 316 with the variance of the tracking resistor, the supply voltage Vdd of the signal path 306 varies accordingly, compensating the variance of the capacitance in the signal path 306.

The variation tracking circuit 302 couples to the voltage regulator 308, and through the voltage regulator 308, couples to the circuit for tuning 304. The variation tracking circuit 302 adjust the reference signal based on the variation of the related tracking resistor. The voltage regulator 308, in response to the reference signal, compensates the variation of the path capacitor.

Figure 4:
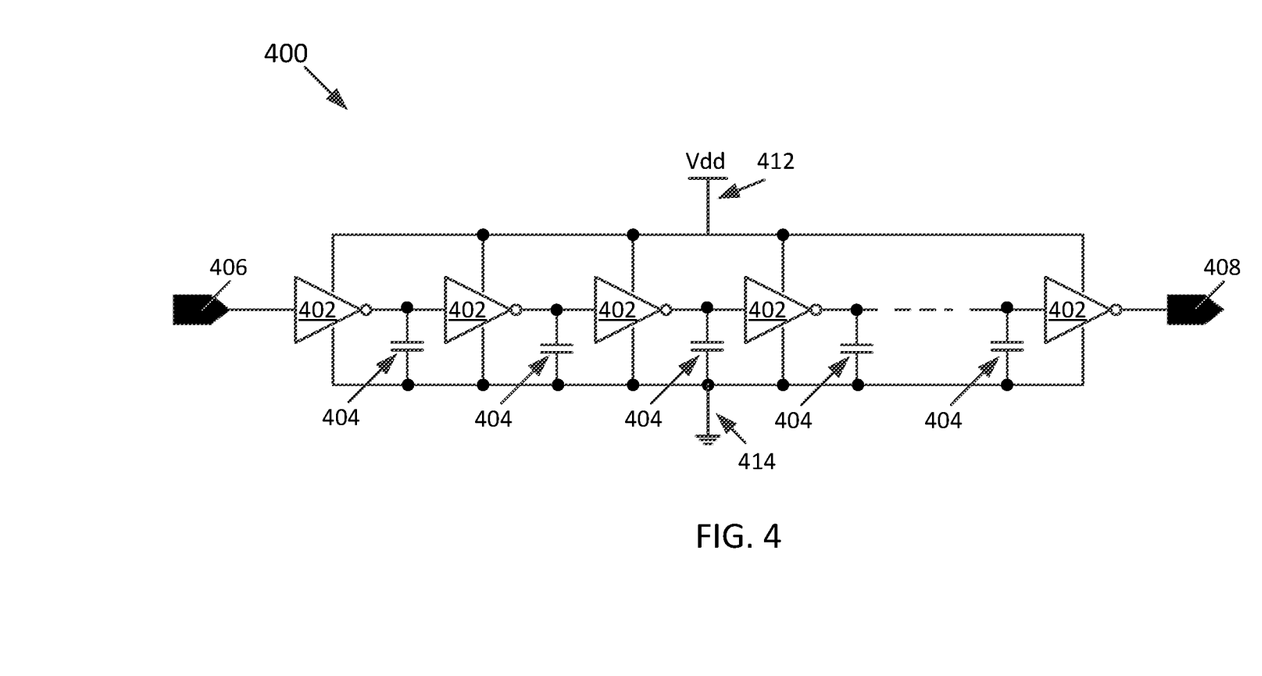
FIG. 4 illustrates an exemplary signal path according to certain aspects of the present disclosure.

FIG. 4 illustrates an exemplary signal path 400 according to certain aspects of the present disclosure. The signal path 400 may be an exemplary embodiment of the signal path 306. The signal path 400 comprises a plurality of inverters 402, one or more inverters of the plurality of inverters 402 are loaded with path capacitors 404. Each of the plurality of inverters 402 is powered by a supply voltage Vdd 412 and a ground 414. The signal path 400 has an input 406 and an output 408. The plurality of inverters 402 may be replaced with other logic gates, such as NAND or NOR gates, and each of the plurality of inverters 402 may be replaced with different types of logic gates. The loading path capacitors 404 may be same or different, and they could be a finger capacitor 100a or a plate capacitor 200a. The loading path capacitors 404 may not necessarily load every logic gate (here inverter 402).

In one embodiment, the signal path 400 is a delay line with an input signal coupled to the input 406 and the output signal coupled to the output 408. In another embodiment, the signal path 400 may be a part of a voltage controlled oscillator (VCO). For a voltage controlled oscillator (VCO), the output 408 may couple back to the input 406.

Figure 5:
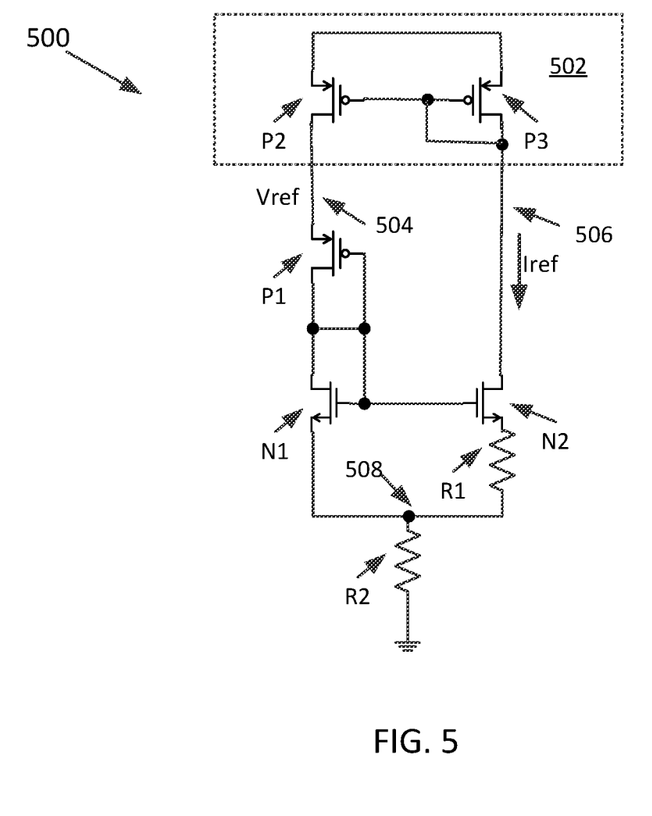
FIG. 5 illustrates an exemplary variation tracking circuit according to certain aspects of the present disclosure.

FIG. 5 illustrates an exemplary variation tracking circuit according to certain aspects of the present disclosure. The variation tracking circuit 500 may be an exemplary embodiment of the variation tracking circuit 302. The variation tracking circuit 500 comprises an NMOS transistor pairs N1 and N2 with their gates coupled together. The source of the NMOS transistor N1 is connected to a common node 508. The source of the NMOS transistor N2, however, is connected to a terminal of a tracking resistor R1. Another terminal of the tracking resistor R1 is connected to the common node 508. In one embodiment, the common node 508 may be a ground. In another embodiment, the common node 508 may be coupled to the ground through another resistor R2. The drain of the NMOS transistor N1 is coupled to the gate of the NMOS transistor N1. A PMOS transistor P1 connects to the drain of the NMOS transistor N1 through the gate and the drain. The drain of the PMOS transistor P1 is connected to a node 504. The drain of the NMOS transistor N2 is connected to a node 506. The node 504 and the node 506 are coupled to a current mirror formed by a PMOS transistor pair, PMOS transistors P2 and P3. The voltage at the node 504 is the reference voltage Vref while the current through the node 506 is the reference current Iref.

The reference current Iref is determined by the gate-source voltage difference between the NMOS transistors N1 and N2 and the resistance of the tracking resistor R1 and can be expressed as $$I_{ref} = \frac{\Delta V_{gs}}{R1}.$$

If there is variation in the tracking resistor R1, such as an increase of resistance value of (the capacitance for respective capacitor decreases), the reference current Iref at the node 506 decreases substantially proportionally (i.e., the reference current Iref at the node 506 decreases proportionally absent of process variation, noise, etc.). In turn, the reference voltage Vref at the node 504 decreases substantially proportionally (i.e., the reference voltage Vref at the node 504 decreases proportionally absent of process variation, noise, etc.). Therefore, if the reference voltage Vref or reference current Iref is used to adjust the supply voltage to a signal path, such as the signal path 400 or 306, the supply voltage decreases or increases as the reference voltage Vref or reference current Iref decreases or increases, respectively. This compensates the potential change of the path delay of the signal path due to variation of the capacitor load.

In addition to tracking the variation of the tracking resistor R1 (thus the variation of the corresponding path capacitor in the signal path), the reference voltage Vref also tracks the transistor variation of the PMOS transistor P1 and NMOS transistor N1, thus tracks the variation of the transistors in the signal path. For this purpose, the variation tracking circuit would like to be placed close to the signal path. For example, in FIG. 3, the variation tracking circuit 302 may be placed next to the signal path 306.

Other variation tracking circuit that generates reference voltage or reference current that tracks the resistance of a tracking resistor may be used. For example, a typical bandgap reference circuit may work as the variation tracking circuit 302 where the corresponding resistor in the bandgap reference circuit is the tracking resistor 100b or 200b.

Figure 6:
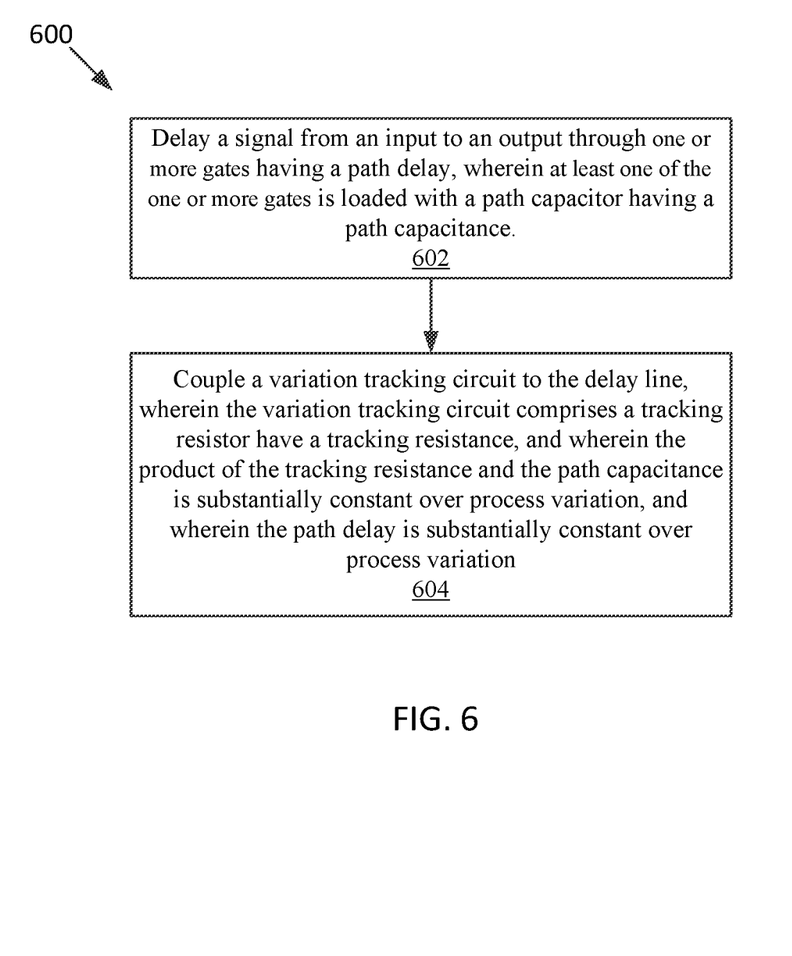
FIG. 6 illustrates an exemplary method in tracking and compensating a signal path variation according to certain aspects of the present disclosure.

FIG. 6 illustrates an exemplary method 600 in tracking and compensating a signal path variation according to certain aspects of the present disclosure. At 602, a signal is delayed from an input (e.g., the input 406) to an output (e.g., the output 408) through one or more logic gates (e.g., one or more of the plurality of inverters 402) having a path delay, wherein at least one of the one or more logic gates is loaded with a path capacitor (e.g., the path capacitor 404, the finger capacitor 100a, or the plate capacitor 200a) having a path capacitance. At 604, a variation tracking circuit (e.g., the variation tracking circuit 500 or 302) is coupled to the one or more logic gates (e.g., through a voltage regulator, such as the voltage regulator 308), wherein the variation tracking circuit comprises a tracking resistor (e.g., the tracking resistor 100b or 200b) have a tracking resistance, and wherein the product of the tracking resistance and the path capacitance is substantially constant over process variation, and wherein the path delay is substantially constant over process variation.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An integrated circuit, comprising:
a signal path having a path delay from an input to an output, wherein the signal path comprises a path capacitor having a path capacitance; and
a variation tracking circuit coupled to the signal path, wherein the variation tracking circuit comprises a tracking resistor having a tracking resistance, and wherein a product of the tracking resistance and the path capacitance is substantially constant over process variation.

2. The integrated circuit of claim 1, wherein the path delay is substantially constant over process variation.

3. The integrated circuit of claim 1, wherein the path capacitor and the tracking resistor are next to each other.

4. The integrated circuit of claim 1, wherein the path capacitor comprises at least two interdigitated fingers in a same metal layer having a finger width and a finger spacing, and wherein the tracking resistor comprises a metal line having the finger width and the finger spacing on the same metal layer.

5. The integrated circuit of claim 1, wherein the path capacitor comprises a plate capacitor having a first plate in a first metal layer, a second plate in a second metal layer, and a dielectric layer between the first metal layer and the second metal layer, and wherein the tracking resistor comprises a plurality of vias in the dielectric layer connecting serially through a plurality of metal pieces in the first metal layer and the second metal layer in an alternating order.

6. The integrated circuit of claim 1, wherein the signal path comprises one or more logic gates, and wherein the path capacitor is configured to load at least one of the one or more logic gates.

7. The integrated circuit of claim 1 further comprising a voltage regulator, wherein the variation tracking circuit couples to the signal path through the voltage regulator.

8. The integrated circuit of claim 7, wherein the voltage regulator is configured to provide a supply voltage to the signal path, and wherein the supply voltage is configured to vary in response to a coupling signal from the variation tracking circuit.

9. The integrated circuit of claim 8, wherein the variation tracking circuit is configured to generate a reference current or a reference voltage that tracks the tracking resistance.

10. The integrated circuit of claim 9, wherein the reference current or the reference voltage is configured to couple to the voltage regulator.

11. The integrated circuit of claim 9, wherein the supply voltage of the signal path is configured to vary in response to the reference current or the reference voltage.

12. The integrated circuit of claim 9, wherein the variation tracking circuit comprises
a first transistor having a first gate, a first drain coupled to a current mirror, and a first source coupled to a first terminal of the tracking resistor, wherein a second terminal of the tracking resistor coupled a common node;
a second transistor having a second gate coupled to the first gate, a second drain coupled to the second gate, and a second source coupled to the common node; and
a third transistor having a third gate coupled to the second gate, a third source coupled to the current mirror, and a third drain coupled to the second gate.

13. The integrated circuit of claim 12, wherein the first transistor and the second transistor are of a first type and the third transistor is of a second type.

14. The integrated circuit of claim 13, wherein the first type is NMOS and the second type is PMOS, and wherein the common node is a ground.

15. The integrated circuit of claim 14, wherein the third source couples to the signal path.

16. The integrated circuit of claim 14, wherein the current mirror couples to the signal path.

17. A method, comprising:
  delaying a signal from an input to an output through one or more logic gates having a path delay, wherein at least one of the one or more logic gates is loaded with a path capacitor having a path capacitance; and
  coupling a variation tracking circuit to the one or more logic gates, wherein the variation tracking circuit comprises a tracking resistor having a tracking resistance, and wherein a product of the tracking resistance and the path capacitance is substantially constant over process variation, and wherein the path delay is substantially constant over process variation.

18. The method of claim 17, wherein the path capacitor and the tracking resistor are next to each other.

19. The method of claim 17, wherein the path capacitor comprises at least two interdigitated fingers in a same metal layer having a finger width and a finger spacing, and wherein the tracking resistor comprises a metal line on the same metal layer having the finger width and the finger spacing.

20. The method of claim 17, wherein the path capacitor comprises a plate capacitor having a first plate in a first metal layer, a second plate in a second metal layer, and a dielectric layer between the first metal layer and the second metal layer, and wherein the tracking resistor comprises a plurality of vias in the dielectric layer connecting serially through a plurality of metal pieces in the first metal layer and the second metal layer in an alternating order.

21. The method of claim 17 further comprising varying a supply voltage of the one or more logic gates in response to a coupling signal from the variation tracking circuit.

22. The method of claim 21, wherein the variation tracking circuit is configured to generate a reference current or a reference voltage that tracks the tracking resistance.

23. The method of claim 22, wherein the supply voltage of the one or more logic gates is varied in response to the reference current or the reference voltage.

24. The method of claim 17, wherein the variation tracking circuit comprises
  a first transistor having a first gate, a first drain coupled to a current mirror, and a first source coupled to a first terminal of the tracking resistor, wherein a second terminal of the tracking resistor coupled to a common node;
  a second transistor having a second gate coupled to the first gate, a second drain coupled to the second gate, and a second source coupled the common node; and
  a third transistor having a third gate coupled to the second gate, a third source coupled to the current mirror, and a third drain coupled to the second gate.

25. The method of claim 24, wherein the third source couples to the one or more logic gates.

* * * * *